United States Patent [19]
El-Kareh et al.

[11] 4,181,981
[45] Jan. 1, 1980

[54] BIPOLAR TWO DEVICE DYNAMIC MEMORY CELL

[75] Inventors: Badih El-Kareh, Milton; John E. Gersbach, Burlington; Russell J. Houghton, Essex Junction, all of Vt.

[73] Assignee: International Business Machines Corporation, Armonk, N.Y.

[21] Appl. No.: 866,126

[22] Filed: Dec. 30, 1977

[51] Int. Cl.² ............................................. G11C 11/40
[52] U.S. Cl. ................................... 365/181; 365/154; 307/238
[58] Field of Search ........................ 365/154, 156, 181; 307/238

[56] References Cited
U.S. PATENT DOCUMENTS 3,697,962   10/1972   Beausoleil et al. .................... 365/181

*Primary Examiner*—Terrell W. Fears
*Attorney, Agent, or Firm*—Francis J. Thornton

[57] ABSTRACT

This describes a novel bipolar dynamic cell especially useful as a Random Access Memory Cell. In the described cell a PNP transistor drives an NPN transistor so that information is stored at the base node of the PNP transistor. By using the PNP transistor as a read transistor and the NPN as a write transistor the cell, when made in integrated form, utilizes the cell isolation capacitance to enhance the stored information without increasing the parasitic capacitances in the cell thereby obtaining greater contrast between 0 and 1 signals than can be obtained in prior art cells. This cell is especially useful in memory arrays.

8 Claims, 4 Drawing Figures

BIPOLAR TWO DEVICE DYNAMIC MEMORY CELL

BACKGROUND OF THE INVENTION

1. Field of the Invention

This invention relates to semiconductor memory cells and more particularly to a memory cell that uses an integrated PNP-NPN device for storage.

2. Description of the Prior Art

Stored charge memory cells of various types are known to the prior art.

U.S. Pat. No. 3,729,719 describes a storage cell uses a PNP-NPN combination coupled together, similar to a silicon controlled rectifier circuit, but biased such that the combination is prevented from latching so that data may be stored on the inherent capacitance of the collector-base PN junctions of both the NPN and PNP transistors. The data is detected at the emitter of the NPN device.

U.S. Pat. No. 3,898,483 also describes a PNP-NPN cell in which both collector-base junctions act to provide a capacitor for capacitive charge storage and the data is detected at the base of the PNP transistor.

U.S. Pat. No. 3,697,962 also discloses a two device cell with the information being stored on both base-collector junctions of both devices with the data being sensed at the base of the PNP transistor.

All the above prior art device thus rely on the base collector junction of both the PNP and the NPN to store data.

SUMMARY OF THE INVENTION

It is an object of the present invention to provide a more efficient bipolar dynamic cell especially useful as a Random Access cell.

It is a further object of the present invention to provide a dynamic cell that has a larger storage capacitance by using the base node of the PNP transistor.

It is still a further object of the present invention to provide a dynamic cell that has a wider and better amplitude output signal, ratio between a stored 1 and 0.

It is an additional object of the present invention to provide a dynamic cell with a more uniform output signal and less signal loss.

It is another object of the present invention to improve the cell such that the cell is relatively unaffected by capacitive tolerances in the devices due to fabrication techniques.

It is still another object of the invention to reduce the required read currents.

It is also an object of the present invention to provide a cell which when created in present day integrated circuit form will result in improved density.

All of these features and advantages are realized in a dynamic Bipolar memory cell which has the read and write transistors reversed from those shown in the prior art. By so reversing the roles of the transistors the cell can be made to employ the base capacitance of the read transistor as the storage node without increasing any parasitic capacitances, present in the cell, thus improving signal ratios and obtaining greater contrast between 0 and 1 signals than could be obtained by known prior art cells.

The cell comprises, in schematic form, a PNP read transistor coupled to an NPN write transistor with the data being stored at the base of the PNP transistor and being sensed at the collector of the PNP transistor.

The foregoing and other objects, features and advantages of the invention will be apparent from the following more particular description of the preferred embodiment of the invention, as illustrated in the accompanying drawings.

DESCRIPTION OF THE PREFERRED EMBODIMENT

Turning now to the figures a full description of the cell of the invention and its mode of operation will be given.

Figure 1:
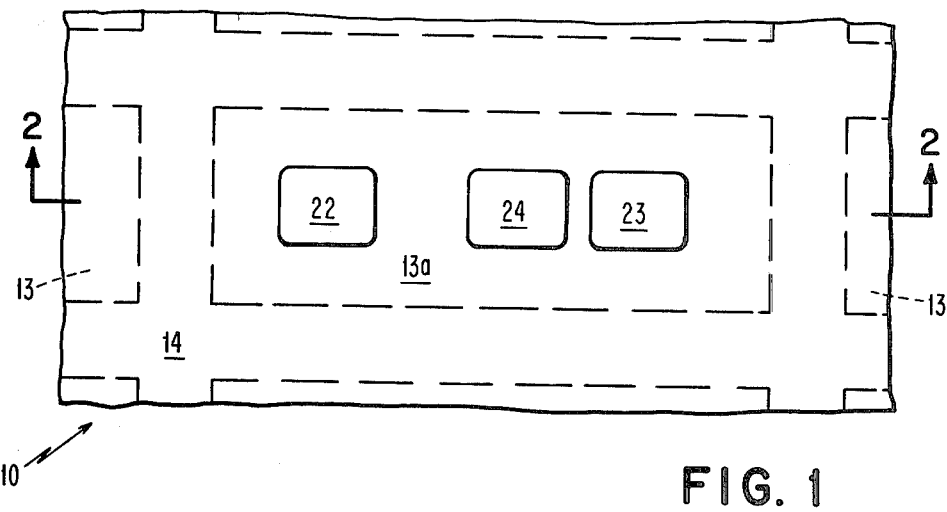
FIG. 1 is a plan view of the surface of a cell built, in accordance with the present invention, in integrated circuit form.
Figure 2:
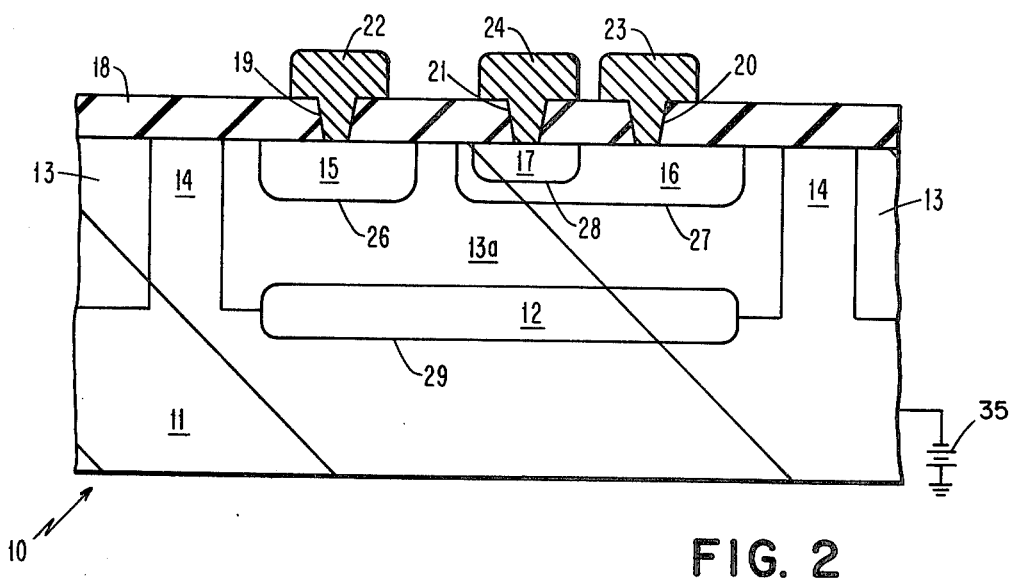
FIG. 2 is a sectional view of the cell of FIG. 1 taken along the lines 2—2 of FIG. 1.

Turning first to FIG. 1 and FIG. 2 there is shown a single isolated cell 10 created using well known integrated circuit techniques. A substrate 11 of P-type material having a resistivity of about 10 ohm-cm is treated with known diffusion techniques such that there is formed therein an N+ subcollector 12. Following creation of this subcollector 12 an N-type epitaxial layer 13 is grown on the substrate.

Once this layer 13 has been grown to the desired thickness, i.e., usually about 5 micron thick, the unit is treated using well known techniques such as diffusion, ion implantation and the like to create a P-type isolation region pattern 14. Thus formed isolation region is such that it penetrates the entire thickness of the epitaxial layer 13 to merge with the P-type substrate 11 so as to completely surround and isolate the formed subcollector region 12 and to isolate and define an island 13a in the epitaxial layer 13 overlying the subcollector region 12.

This defined island and subcollector combination is thus completely enclosed by a PN junction 29 which lies between the isolation region and island 13a and the subcollector 12 and substrate 11.

Subsequently two P-type regions 15 and 16 are formed in the upper surface of island 13a. Region 15 forms a PN junction 26 with the underlying epitaxial island 13a. Region 16 forms a similar PN junction 27 with the island 13a. Thereafter an N-type diffusion 17 is formed inside the perimeter of P-type diffusion 16 to form a PN junction 28 with region 16. Once these diffusions are complete the surface of the device is provided with a layer 18 of a silicon dioxide approximately 3000 Å thick. Through this layer three different windows or via holes 19, 20, and 21 are formed over the respective diffusions 15, 16, and 17. Conductive material, i.e, aluminum dots 22, 23, and 24, is then placed in the windows to make contact with the underlying regions 15, 16, and 17.

Figure 3:
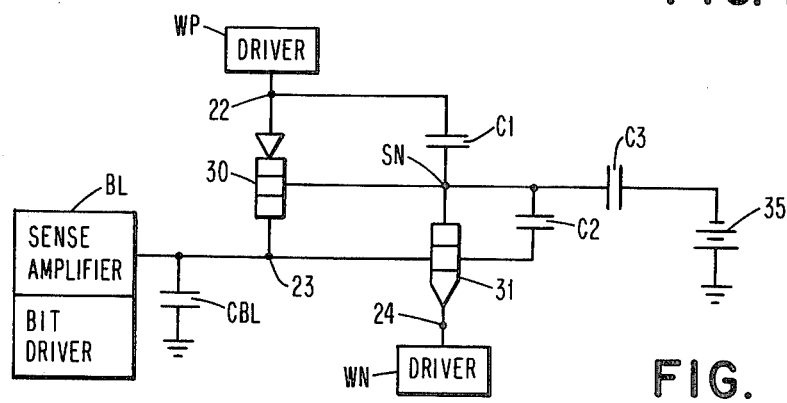
FIG. 3 is a schematic of the cell of FIG. 1 and FIG. 2 in a simple array.

The PNP transistor 30, shown schematically in FIG. 3 is thus comprised of region 15, which serves as an emitter, region 13a serves as a base, and region 16 serves as a collector.

The NPN transistor 31 is defined by region 17 which serves as an emitter, region 16 which functions as a base region and region 13a which together with subcollector 12 functions as a collector.

When the cell is to be operated in an array it is necessary that a first driver circuit WP be coupled through a read line to the contact 22. This is shown schematically in FIG. 3 where the contact 22 is shown as a node and serves as a read line contact. A second driver circuit WN is coupled through a write line to the contact 24 which now serves as a write line contact. These driver circuits may be any known prior art circuits capable of applying suitable voltage pulses to the respective read and write lines. Thus the PNP transistor 30 is used as a read transistor and the NPN transistor is used as the write transistor. A known sense amplifier/bit driver circuit BL is coupled to the contact 23 which functions as a bit line contact.

The capacitor C1 shown across the emitter and base of the PNP transistor 30 illustrates the junction capacitance of the PN junction 26. The capacitor C2 shown across the base and collector of the NPN transistor 31 illustrates the junction capacitance of PN junction 27. The capacitance C3 illustrates the junction capacitance of PN junction 29 which encloses the subcollector 12 and the island 13a. The substrate 11 is coupled to a fixed potential illustrated by battery 35. Each of these capacitors C1, C2 and C3 thus enjoys a common reference point, i.e., the defined epitaxial island 13a. In the present invention, it is this region 13a in which the information is stored.

Capacitance C1 and C2 are both small with respect to capacitor C3. Capacitor C3 is typically 4 to 5 times larger than capacitor C1. Capacitance C1 and C2 track one another, i.e., have the same relative characteristics because both are depletion capacitance between simultanously diffused P regions 15 and 16 and the defined N-type epitaxial island 13a.

This region 13a in which charge storage occurs is illustrated schematically at the common juncture SN of the three capacitors C1, C2, and C3.

The use of this region of the cell as the storage node has a number of significant advantages not shown or taught in, or obvious from the prior art.

Thus because capacitor C3 is larger than either capacitor C2 or C1 the device has a better output signal amplitude ratio between a 0 and a 1. The device has a smaller bit line capacitor CBL and less signal loss.

Also because the cell uses the PNP as the read device and during the read 1 operation both capacitor C2 and capacitor C3 act in parallel, a significantly larger sense signal can be realized from the cell of the present invention than could be obtained from the prior art cells. Additionally, this use of the PNP as the read device requires less charge in turn on the PNP and once it turns on more charge is realized at the bit line Sense Ampifier BL. This occurs because the ratio of C1 to (C2+C3) is small and once the PNP read transistor turns on the voltage across capacitor C1 no longer changes due to the character of the emitter base junction 26 of the PNP. Thus during reading of the cell capacitor C1 virtually disappears and does not affect the operation of the cell.

Moreover it is because the NPN transistor is used as a write transistor that faster writing of this cell, compared to prior art cells, is realized, because NPN transistors have a significantly better frequency response compared to PNP transistors.

Because the read operation in this cell is destructive, i.e., the data is reset to a 0 regardless of its previous condition, it is necessary to regenerate or write the cell after every read operation.

Figure 4:
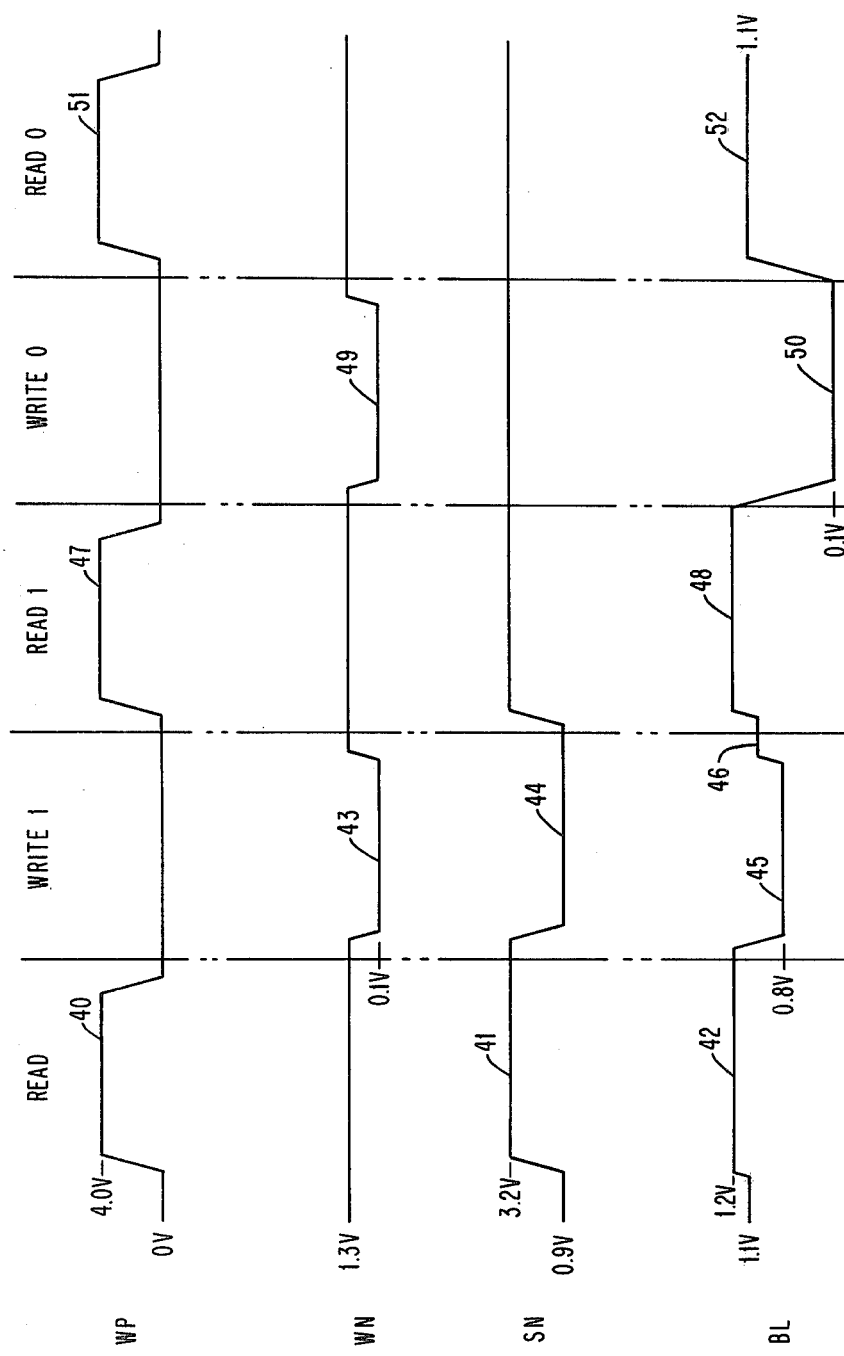
FIG. 4 shows the various voltage pulses applied to the cell in order to read and write the cell.

Turning now to FIG. 4, taken in conjunction with the other figures, a description of the read and write operations of the cells will be given.

Initially it will be assumed for purposes of illustration only, that the storage node SN is at 0.9 V, that is the storage node is effectively discharged. Because the read operation is destructive a read operation will be performed before any write operations are performed to assure that the cell is in a known state.

During reading driver WP is caused to rise from ground or zero volts to 4.0 volts thus applying a positive 4.0 volts pulse 40 to the node 22 and the emitter of the PNP transistor 30. Simultaneously the driver WN is held at its quiescent voltage of 1.3 volts. These applied voltages turn on the PNP transistor 30 and charge flows through the PNP emitter-base junction and causes the storage node SN to charge, from its discharged state of 0.9 volts, to its charged state of 3.2 volts. This change is shown as pulse 41. Since the read pulse 40 remains at 4.0 volts after the storage node SN reaches 3.2 volts, transistor 30 remains on and charge flows through the collector of the PNP transistor 30 to charge the bit line from 1.1 volts to 1.2 volts as indicated by pulse 42. This voltage change on the bit line is detected by the bit line sense amplifier BL. Because the charge flow across the emitter-base junction of the PNP transistor is equal to the value Beta of the PNP transistor times the charged transferred to its base, the cell can be made smaller. Although the capacitances are also made smaller, this Beta amplification assures that a detectable signal level can be realized. This read period is terminated by terminating pulse 40 by bringing the driver circuit WP back to zero volts. The write 1 operation is initiated by holding WP at zero volts and setting the bit line to 0.8 volts by the bit driver portion of the circuit BL and pulling WN down from its quiescent voltage of 1.3 volts to a level of 0.1 volts shown by pulse 43 causing the transistor 30 to conduct and storage node SN to be discharged to 0.9 volts shown by pulse 44. When the pulse 43 terminates and the write driver WN returns to its quiescent voltage of 1.3 volts the bit line voltage is reset to 1.1 volts indicated by step 46 by bit driver BL. By discharging the storage node, a 1 has been written into the cell.

Following this writing of a 1 in the cell it may be read by applying a 4.0 pulse 47 from the read driver WP while holding the write driver at its quiescent voltage of 1.3 volts. Once again this causes the storage node SN to charge and it rises to 3.2 volts. Simultanously the bit line BL begins to charge to 1.2 volts. This 0.1 voltage change on the bit line, detected by the bit line sense amplifier, indicates a 1 was stored therein.

Because this read pulse is destructive and causes the storage node to charge to 3.2 volts it effectively writes a 0 into the cell. However, because of design considerations it is necessary to perform a write cycle sequential to a read cycle. In this case, called for convenience, a write 0, the read driver WP is held at zero volts, the write driver WN is pulled down to 0.1 volts as indicated by pulse 49. In this instance, however, because the bit line is held at 0.1 volts by the bit driver (pulse 50) the NPN transistor 31 is prevented from conducting and there is no change in the state of the storage node SN because it was previously charged by the read 1 cycle and it remains at 3.2 volts. It is necessary to pull the bit line down to 0.1 volts to assure that the NPN transistor 31 is not turned on and a 1 is not inadvertently written into the cell. When the write driver pulse 49 terminates the bit line BL is restored to the normal level of 1.1 volts by the bit driver circuit portion of the bit line sense amplifier/bit driver circuit BL.

Again to read the stored zero the read driver WP is raised to 4.0 volts (pulse 51). However, because the storage node SN is fully charged, transistor 30 does not turn on and no change in the state of the storage node or in the state of the bit line BL occurs indicating that a 0 has been stored in the storage node of the cell.

While the invention has been particularly shown and described with reference to the particular embodiment thereof, it will be understood by those skilled in the art that changes made be made therein without departing from the spirit and scope thereof.

What is claimed is:

1. A dynamic bipolar memory array comprising:
    a read line,
    a bit line,
    a pair of complementary transistors each having a base, a collector and an emitter,
    one of said pair of transistors being a read transistor having its emitter coupled to said read line,
    the other of said pair of transistors being a write transistor having its emitter coupled to said write line,
    the base of the write transistor being connected to the collector of the read transistor and to said bit line,
    the base of the read transistor being connected to the collector of the write transistor, and
    a storage node capacitor connected between the base of said read transistor and a fixed potential.

2. The array of claim 1 wherein said read transistor is a PNP transistor and said write transistor is an NPN transistor.

3. The array of claim 2 further including a read driver is coupled to said read line, a write driver is coupled to said write line and a sense amplifier bit driver is coupled to said bit line.

4. The array of claim 1 wherein said storage node capacitor has a value greater than the base to collector capacitance of said transistors.

5. A dynamic bipolar memory for storing digital information comprising
    a cell comprised of,
    an NPN and a PNP interconnected bipolar transistor, each of which has an emitter, a base and a collector region, and a collector to base capacitance, and
    a storage node capacitor connected between the base of said PNP transistor and the collector of said NPN transistor and a fixed potential for storing a bit of digital information,
    bit driver means connected to the collector of the PNP and the base of the NPN for writing information into said cell,
    a first means connected to the emitter of the PNP transistor for applying a read pulse to said cell to charge said storage node capacitor and said collector to base capacitance to a first binary state,
    a second means connected to the emitter of the NPN transistor for applying a write pulse to said cell to discharge said storage node capacitor and said collector to base capacitance to a second binary state, and
    sensing means connected to the collector of the PNP transistor and the base of the NPN transistor for determining the binary state of the storage node capacitor and said collector to base capacitance.

6. The dynamic bipolar memory cell of claim 5 wherein said cell includes
    a semiconductor substrate,
    an epitaxial layer on said substrate,
    each of said transistors being formed in said layer on said substrate, and
    said storage node capacitor is comprised of the collector to substrate capacitance of the NPN transistor and the base to substrate capacitance of the PNP transistor.

7. The cell of claim 6 wherein said NPN transistor is a vertical transistor formed in said layer on said substrate and said PNP transistor is a lateral transistor formed in said layer on said substrate and said base region of said PNP transistor is the collector region of said NPN transistor.

8. An integrated dynamic bipolar memory comprising:
    a body of semiconductor material of a first conductivity type connected to a fixed potential,
    an epitaxial layer of a second conductivity type on said body forming the base of one of a pair of complementary transistors and the collector of the other of said pair of transistors,
    first and second diffused regions of said first conductivity type in said layer,
    a third diffused region of said second conductivity type in said second diffused region;
    said first region forming the emitter of said one of said pair of transistors,
    said second region forming the collector of said one of said pair of transistors and the base of said other of said pair of transistors,
    said third region forming the emitter of said other of said pair of transistors,
    fixed potential means connected to said body,
    bit driver means coupled to the base of said other one of said pair of transistors for storing binary information in said memory,
    first driver means coupled to the emitter of said one of said pair of transistors for charging said epitaxial layer with respect to said body to indicate a first storage state in said cell,
    second driver means coupled to the emitter of the other one of said pair of transistors for discharging said epitaxial layer with respect to said body to indicate a second storage state in said cell, and
    sensing means coupled to the base of said other one of said pair of transistors for sensing the state of said layer.

* * * * *

UNITED STATES PATENT OFFICE
CERTIFICATE OF CORRECTION

PATENT NO. : 4,181,981
DATED : January 1, 1980
INVENTOR(S) : B. El-Kareh, J. E. Gersbach and R. J. Houghton It is certified that error appears in the above-identified patent and that said Letters Patent are hereby corrected as shown below:

Column 5, line 26

Delete "said" and insert --a--.

Signed and Sealed this

Eighth Day of April 1980

[SEAL]

Attest:

SIDNEY A. DIAMOND

Attesting Officer Commissioner of Patents and Trademarks